(12) United States Patent
Wilner et al.

(10) Patent No.: US 8,245,579 B2
(45) Date of Patent: Aug. 21, 2012

(54) DISCERNING BETWEEN SUBSTANCES

(75) Inventors: Corey Steven Wilner, Buffalo Grove, IL (US); Viktor Kremin, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 964 days.

(21) Appl. No.: 12/262,640

(22) Filed: Oct. 31, 2008

(65) Prior Publication Data

US 2009/0120697 A1    May 14, 2009

Related U.S. Application Data

(60) Provisional application No. 60/984,828, filed on Nov. 2, 2007.

(51) Int. Cl.
*G01B 7/16* (2006.01)
(52) U.S. Cl. .................................................. 73/780
(58) Field of Classification Search ............... 73/760, 73/780
See application file for complete search history.

(56) References Cited

U.S. PATENT DOCUMENTS

| | | | | |
|---|---|---|---|---|
| 3,900,266 A | * | 8/1975 | Takahashi et al. | 356/442 |
| 3,960,490 A | * | 6/1976 | Giaever | 436/515 |
| 3,971,660 A | * | 7/1976 | Staehle | 430/18 |
| 4,063,510 A | * | 12/1977 | Ishii et al. | 102/301 |
| 4,966,457 A | * | 10/1990 | Hayano et al. | 356/239.7 |
| 4,969,741 A | * | 11/1990 | Kennedy et al. | 356/338 |
| 5,466,348 A | * | 11/1995 | Holm-Kennedy | 205/775 |
| 6,520,011 B2 | * | 2/2003 | Nakamura | 73/304 C |
| 6,738,529 B1 | * | 5/2004 | Crevier et al. | 382/282 |
| 6,828,800 B2 | * | 12/2004 | Reich et al. | 324/658 |
| 7,868,758 B2 | * | 1/2011 | Barral et al. | 340/551 |
| 8,100,581 B2 | * | 1/2012 | Djordjevic | 374/122 |
| 2002/0032531 A1 | | 3/2002 | Mansky et al. | |
| 2003/0213503 A1 | | 11/2003 | Price et al. | |
| 2004/0163480 A1 | | 8/2004 | Benestad | |
| 2005/0155393 A1 | | 7/2005 | Wright et al. | |
| 2008/0047764 A1 | | 2/2008 | Lee et al. | |

OTHER PUBLICATIONS

International Search Report of International Searching Authority, dated Jan. 2, 2009 for International Application No. PCT/US2008/012370; 2 pages.

International Written Opinion of International Searching Authority, dated Jan. 2, 2009 for International Application No. PCT/US2008/012370; 5 pages.

* cited by examiner

*Primary Examiner* — Max Noori

(57) ABSTRACT

A method and apparatus to detect the presence of a material at a sensing device and to determine whether the material is a first material having a first material property or a second material having a second material property.

23 Claims, 10 Drawing Sheets

DISCERNING BETWEEN SUBSTANCES

RELATED APPLICATIONS

This application claims the benefit of U.S. Provisional Application No. 60/984,828 filed on Nov. 2, 2007.

TECHNICAL FIELD

This disclosure relates to the field of non-contact sensing devices and, in particular, to capacitive-sensing devices.

BACKGROUND

One type of non-contact sensing device is a sensing device that operates by way of capacitance sensing. A capacitance sensing device includes an array of one or more capacitive sensors. The capacitance detected by a capacitive sensing device changes as a function of the proximity of a conductive object or substance to the device. The conductive object or substance can be, for example, a stylus, a user's finger, or detergent in an appliance's detergent reservoir.

In a capacitive sensing device, a change in capacitance detected by a capacitive sensor due to the proximity of a conductive object or substance can be measured by a variety of methods. Regardless of the method, usually an electrical signal representative of the capacitance detected by the capacitive sensor is processed by a processing device, which in turn develops electrical signals representative of the presence of the conductive object or substance in proximity to the capacitive sensing device.

In addition to the presence of a conductive object or substance, a capacitive sensing device is also subject to the effects of environmental factors such as thermal effect due to ambient temperature or moisture effects due to ambient humidity. In a system of identical capacitive sensing devices, changes in ambient temperature will affect the capacitance detected by the sensors because the self-capacitance of the sensors changes with temperature. In general, the capacitance detected by the sensors changes linearly with changes in temperature. In some systems, the capacitance detected has a positive temperature coefficient, and in others will have a negative coefficient. The effect on detected capacitance in all sensors due to changes in ambient temperature is known as temperature drift. With users expecting computing devices that employ capacitive sensors to be able to operate over a wide temperature range, compensation for temperature drift may be required to meet performance specifications.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described to detect the presence of a material at a sensing device and to determine whether the material is a first material having a first material property or a second material having a second material property. The material may be a conductive substance, for example, a detergent residing in a detergent reservoir adjacent to the sensing device. In one embodiment, the method includes determining an increase in capacitance by comparing the difference between capacitance values sensed by a first and second capacitive sensor before the conductive substance is detected to the difference between the capacitance values after the conductive substance is detected. If the increase in capacitance is in a first range, the conductive substance may be determined to be a powder, and if the increase in capacitance is greater than the first range, the conductive substance may be determined to be a gel.

Figure 1:
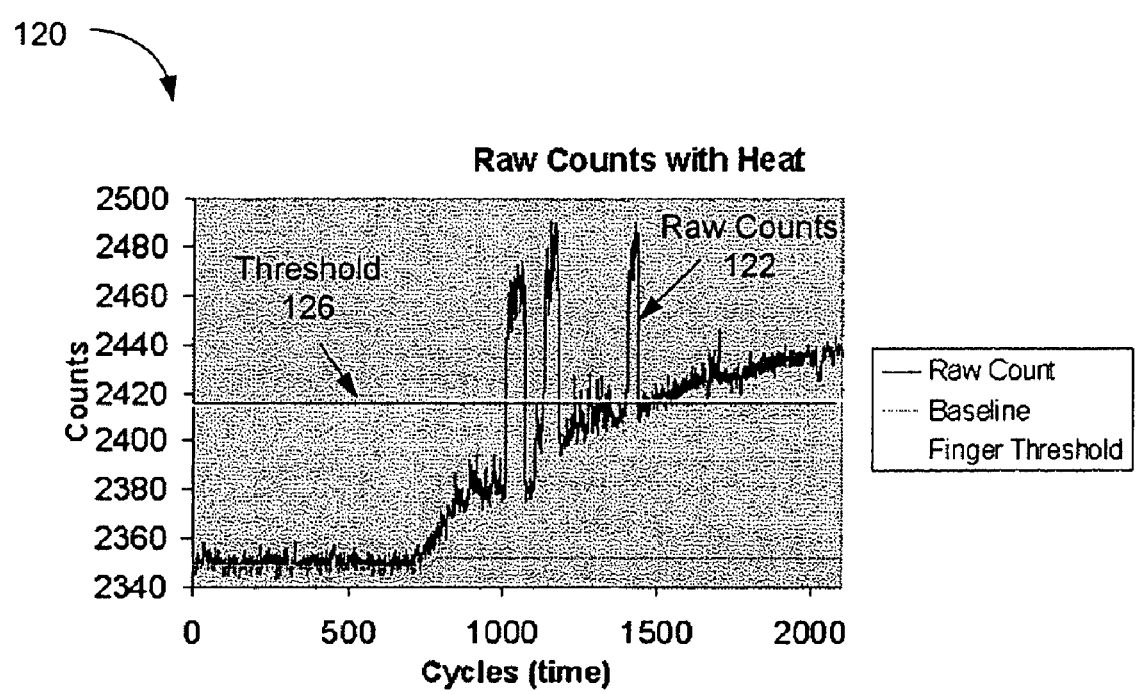
FIG. 1 illustrates a graph of effects of rising temperature and detection of a conductive object on the capacitance measured by a capacitive sensing device according to an embodiment.

With capacitive sensors, capacitance may be measured in terms of raw counts (e.g., the higher the capacitance the higher the raw counts). When a conductive object or substance comes in proximity to the capacitive sensor the raw counts increase. Referring to graph 120 of FIG. 1, the processing device can determine if a conductive object or substance is present by comparing the raw counts 122 (representing the capacitance due to the presence of a conductive object or substance) to a threshold. If the raw count value 122 exceeds the threshold 126, a conductive object or substance is deemed to be present and appropriate actions are taken. As heat or humidity is applied over time (shown as cycles of oscillation), the raw counts 112 increase and the capacitance measured by the sensor increases over time as a result. If enough heat or humidity is applied, the raw counts 112 may exceed the threshold 126, resulting in a false detection of a conductive object or substance.

Figure 2:
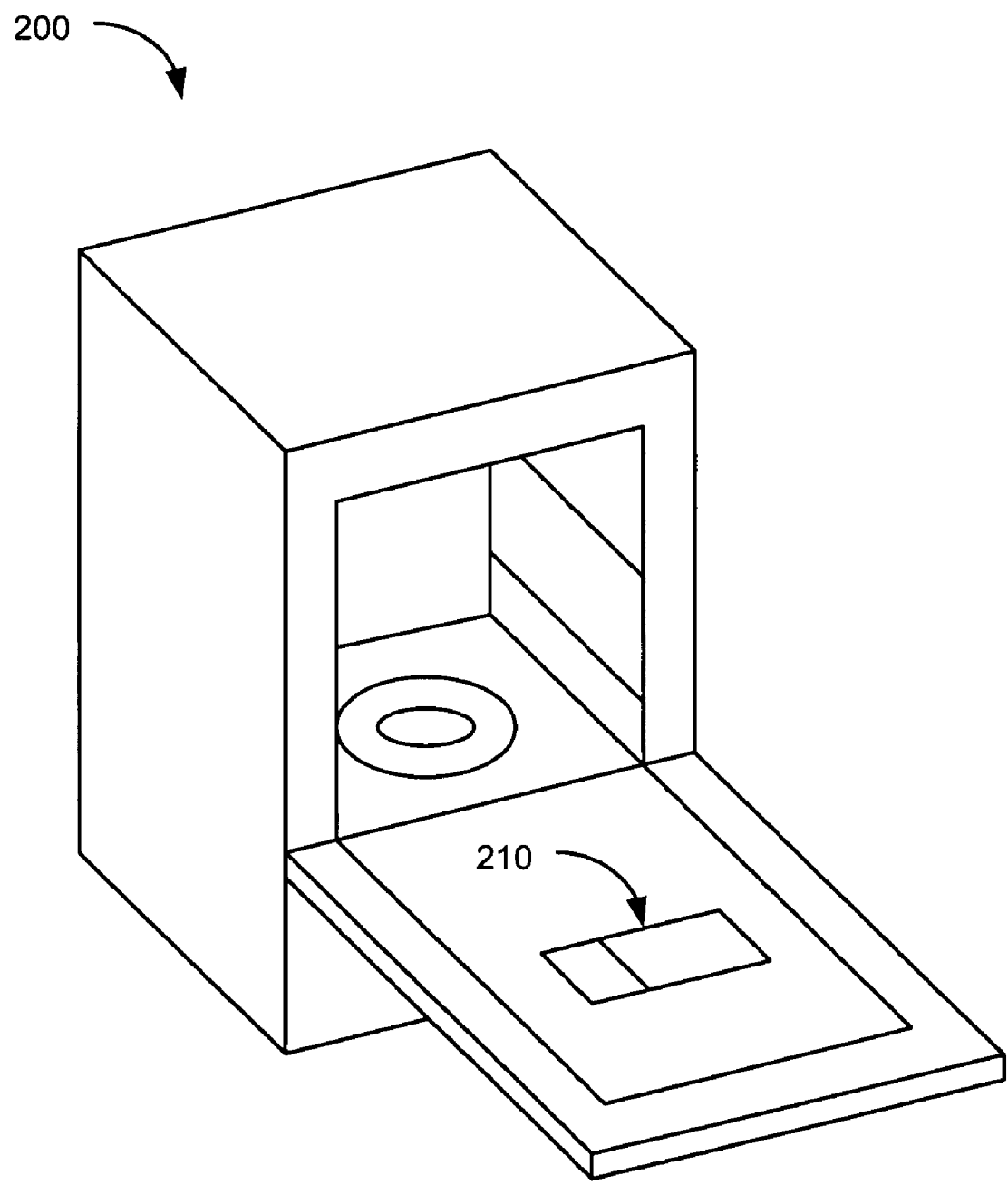
FIG. 2 illustrates an appliance implementing a capacitive sensing device to determine the detergent type, according to one embodiment of the present invention.

FIG. 2 illustrates an appliance implementing a capacitive sensing device to determine whether detergent added to a detergent reservoir of the appliance is a gel or a powder, according to one embodiment of the present invention. Appliance 200 is representative of any appliance such as a dishwasher, clothes washing machine or other appliance that may implement a detergent sensing device. In one embodiment the sensing device is a capacitive sensing device such as a differential capacitive sensor. In alternative embodiments, other types of sensing devices are used. In this embodiment, the capacitive sensing device is located adjacent to detergent reservoir 210 of appliance 200. In one embodiment, the capacitive sensing device includes a first capacitive sensor and a second capacitive sensor. In an alternative embodiment, the capacitive sensing device includes a capacitive sensor and a dedicated temperature sensor. The capacitive sensing device will be discussed further below with respect to FIG. 5.

Figure 3:
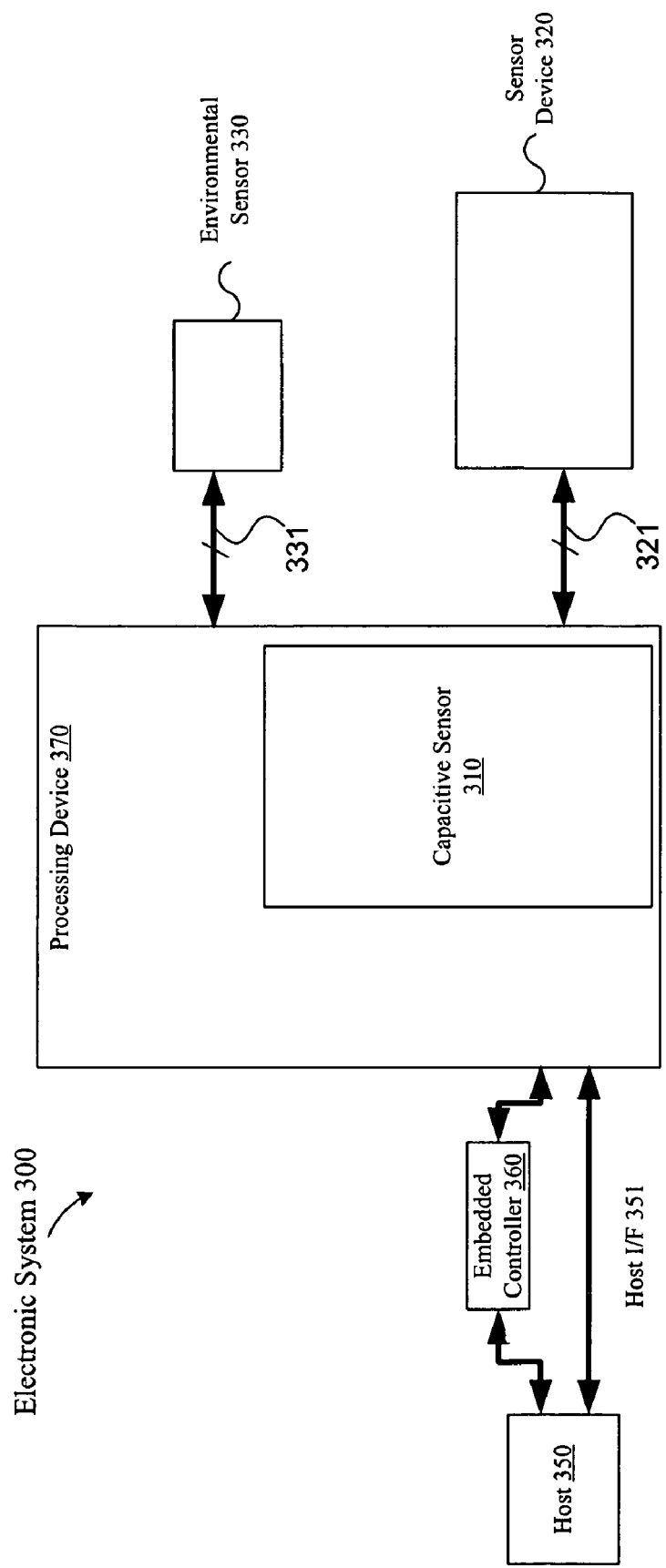
FIG. 3 illustrates a block diagram of one embodiment of an electronic system having a processing device for detecting a presence of an object.

FIG. 3 illustrates a block diagram of one embodiment of an electronic system having a processing device for detecting a presence of a conductive object. Electronic system 300 includes processing device 370, sensor device 320, environmental sensor 330, host processor 350, and embedded controller 360. As illustrated, capacitive sensor 310 may be integrated into processing device 370. Capacitive sensor 310 may include analog I/O for coupling to an external component, such as sensor device 320, and/or other devices.

In one embodiment, the electronic system 300 includes sensor device 320 coupled to the processing device 370 via bus 321. Sensor device 320 may include one or more sensor elements. For sensor device 320, the one or more sensor elements may be coupled together to detect a presence of a conductive object over the entire surface of the sensor device. Alternatively, sensor device has a single sensor element to detect the presence of the conductive object. In one embodiment, sensor device 320 may be a capacitive sensor device. Capacitive sensor elements may be used as non-contact switches. In one embodiment, sensor device 320 sends signals via bus 321 to processing device 370 representing a capacitance measured by sensor device 320.

The electronic system 300 may include any combination of one or more of the sensor devices. In an alternative embodiment, the electronic system 700 may also include environmental sensor element 330 coupled to the processing device 370 via bus 331. The environmental sensor element 330 may include a temperature sensor, a humidity sensor, or other sensor type. In one embodiment, buses 321 and 331 may be a single bus. Alternatively, these buses may be configured into any combination of one or more separate signals or buses.

In one exemplary embodiment, processing device 370 may be the Programmable System on a Chip (PSoC®) processing device, developed by Cypress Semiconductor Corporation, San Jose, Calif. Alternatively, processing device 370 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s). Processing device 370 may communicate with an external component, such as a host processor 350, via host interface (I/F) line 351.

It should also be noted that the embodiments described herein are not limited to having a configuration of a processing device coupled to a host, but may include a system that measures the equivalent capacitance on the sensing device and sends the raw data to a host computer where it is analyzed by an application. In effect the processing that is done by processing device 370 may also be done in the host. In another embodiment, the processing device 370 is the host.

It should be noted that the components of electronic system 300 may include all the components described above. Alternatively, electronic system 300 may include only some of the components described above, or include additional components not listed herein.

It should be noted that any one of various known methods for measuring capacitance may be used, for example relaxation oscillator methods, current versus voltage phase shift measurement, resistor-capacitor charge timing, capacitive bridge divider, charge transfer, successive approximation, sigma-delta modulation, charge-accumulation circuits, field effect, mutual capacitance, frequency shift, or the like. These sensing methods are well known to one of ordinary skill in the art. Accordingly, a detailed description of these sensing methods is not included so as not to obscure the present invention.

Figure 4A:
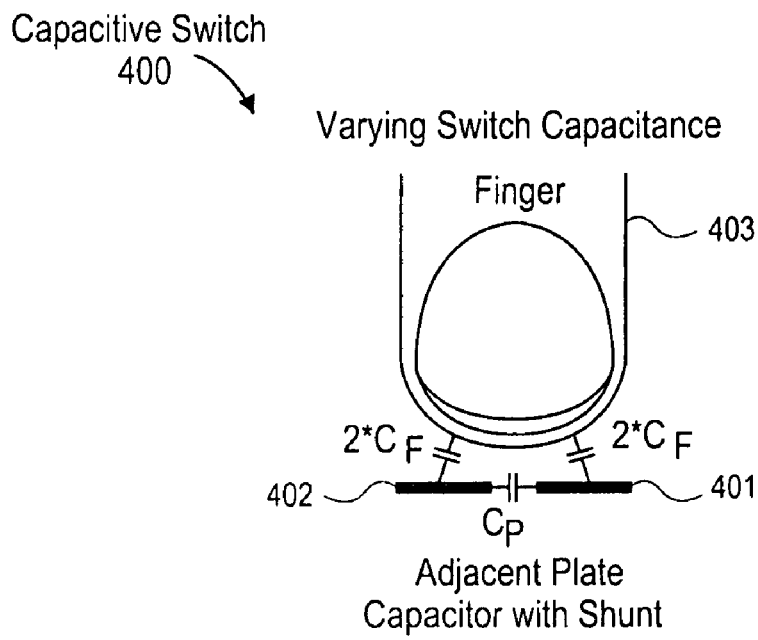
FIG. 4A illustrates one embodiment of a capacitive switch.

FIG. 4A illustrates how a conductive object or substance may affect the capacitance of a capacitive touch-sensor device. In its basic form, a capacitive switch 400 is a pair of adjacent plates (electrodes) 401 and 402. There is a small edge-to-edge capacitance $C_p$, but the intent of switch layout is to minimize the base capacitance $C_p$ between these plates. When a conductive object or substance 403 (e.g., a finger or detergent) is placed in proximity to the two plates 401 and 402, there is a capacitance $2*C_F$ between one electrode 401 and the conductive object 403 and a similar capacitance $2*C_F$ between the conductive object 403 and the other electrode 402. The capacitance $2*C_F$ between electrode 401 and the conductive object 403 and the capacitance $2*C_F$ between electrode 402 and the conductive object 403 add in series to yield a capacitance $C_F$. That capacitance adds in parallel to the base capacitance $C_p$ between the plates 401 and 402, resulting in a change of capacitance $C_F$ over the baseline capacitance. Capacitive switch 400 may be used in a capacitive switch array. The capacitive switch array is a set of capacitors where one electrode of each capacitor is grounded. Thus, the active capacitor has only one accessible side. The presence of the conductive object 403 increases the capacitance $(C_p+C_F)$ of the capacitive switch 400 to ground. Determining switch activation is then a matter of measuring the change in the capacitance $(C_F)$ or capacitance variation. Capacitive switch 400 is also known as a grounded variable capacitor. In one exemplary embodiment, $C_F$ may be in approximately a range of 10 to 30 picofarads (pF). Alternatively, other ranges may be used.

The conductive object in FIG. 4A is shown as a finger for ease of illustration. However, it should be understood that this technique may be applied to any conductive object or substance, for example, a gel detergent or a powder detergent in a detergent reservoir.

Figure 4B:
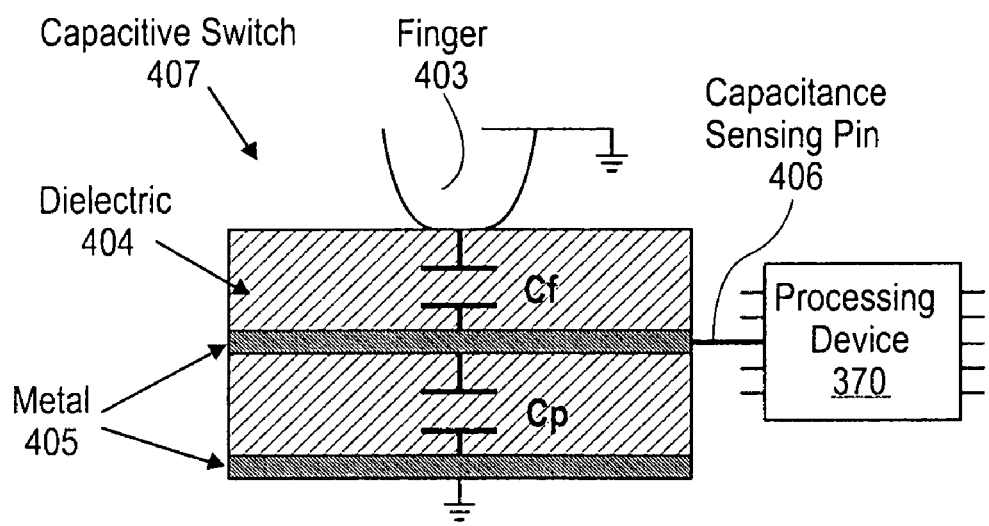
FIG. 4B illustrates one embodiment of a sensing device coupled to a processing device.

FIG. 4B illustrates one embodiment of a capacitive switch 407 coupled to a processing device 370. Capacitive switch 407 illustrates the capacitance as seen by the processing device 370 on the capacitance sensing pin 406. When a conductive object or substance 403 (e.g., a finger or detergent) is placed in proximity to one of the metal plates 405, there is an effective capacitance, $C_F$, between the metal plate and the conductive object 403 with respect to ground. Also, there is a capacitance, $C_p$, between the two metal plates. Accordingly, the processing device 430 can measure the change in capacitance, capacitance variation $C_F$, when the conductive object is in proximity to the metal plate 405. Above and below the metal plate that is closest to the conductive object 403 is dielectric material 404. The dielectric material 404 above the metal plate 405 can be an overlay. The overlay may be non-conductive material used to protect the circuitry from environmental elements and to insulate the conductive object or substance from the circuitry. FIG. 4B, by way of example, illustrates a finger representing conductive object 403, however in alternative embodiments, conductive object 403 may be any conductive object or substance, for example, a gel detergent or a powder detergent.

Figure 5:
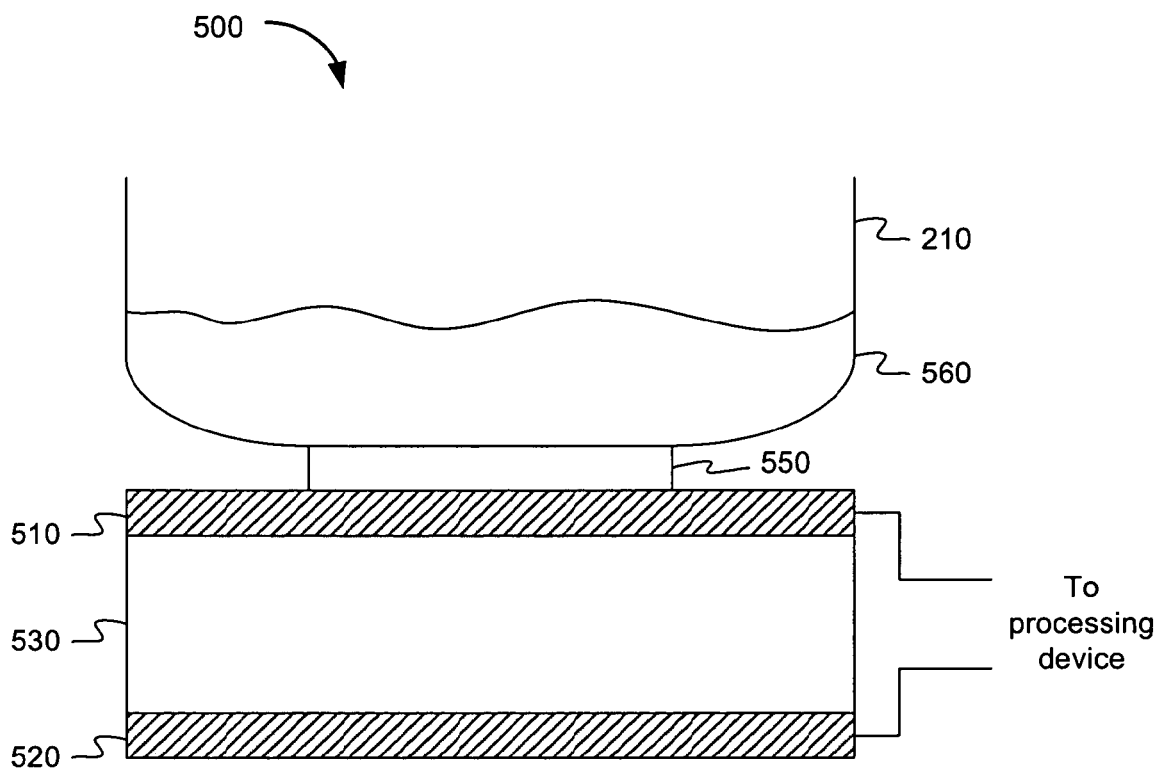
FIG. 5 illustrates a cross-section view of a differential capacitive sensor according to one embodiment of the present invention.

FIG. 5 illustrates a cross-section view of a differential capacitive sensor according to one embodiment of the present invention. In one embodiment, sensor apparatus 500 includes a first capacitive sensor device 510 and a second capacitive sensor device 520. The capacitive sensor devices 510 and 520 are separated by a non-conducting substrate 530. In one embodiment, the differential capacitive sensor is affixed to the underside of detergent reservoir 210 with adhesive material 550. Detergent reservoir 210 may be part of an appliance such as appliance 200 of FIG. 2 and may be used to hold detergent 560.

Capacitive sensor devices 510 and 520 may be similar to metal plates 405 of FIG. 4B. In one embodiment, capacitive sensor devices 510 and 520 are made from a conductive material. For example, capacitive sensor devices 510 and 520 may be made from copper or other metal. In one embodiment, capacitive sensor devices 510 and 520 are arranged substantially parallel to one another and parallel to the bottom outer surface of detergent reservoir 210. In alternative embodiments, capacitive sensor devices 510 and 520 have other orientations. One of capacitive sensor devices 510 and 520 is situated closer to detergent reservoir 210. In one embodiment capacitive sensor device 510 is closer, however in an alternative embodiment, capacitive sensor device 520 is closer to the reservoir 210.

Capacitive sensor devices 510 and 520 may be separated from one another by a non-conducting substrate 530. In one embodiment, non-conducting substrate 530 is a dielectric such as printed circuit board (PCB) material (e.g., polytetrafluoroethylene, FR-1, FR-4, CEM-1, CEM-3, etc.). In alternative embodiments, non-conducting substrate 530 is some other non-conducting material. An adhesive material 550 may be used to secure capacitive sensor device 510 to the bottom outer surface of detergent reservoir 210. Adhesive material 550 may be glue, tape, epoxy, or other adhesive material.

Capacitive sensor devices 510 and 520 may be used to sense capacitance values attributable to the detergent 560 in detergent reservoir 210 as well as environmental factors. Capacitance is measured in terms of raw counts (e.g., the higher the capacitance the higher the raw counts). In one embodiment, capacitive sensor devices 510 and 520 alternate between measuring a count value and being grounded. For example, first, capacitive sensor device 510 measures a count value while capacitive sensor device 520 is grounded. Then, capacitive sensor device 510 is grounded and capacitive sensor device 520 measures a count value. The count values are provided to a processing device such as processing device 370 of FIG. 3. In alternative embodiments, capacitive sensor device 520 measures a count value first while capacitive sensor device 510 is grounded and then capacitive sensor device 510 measures a count value while capacitive sensor device 520 is grounded. In one embodiment where capacitive sensor devices 510 and 520 are located adjacent to detergent reservoir 210, capacitive sensor devices 510 and 520 are able to sense capacitance values without contacting detergent 560.

Figure 6:
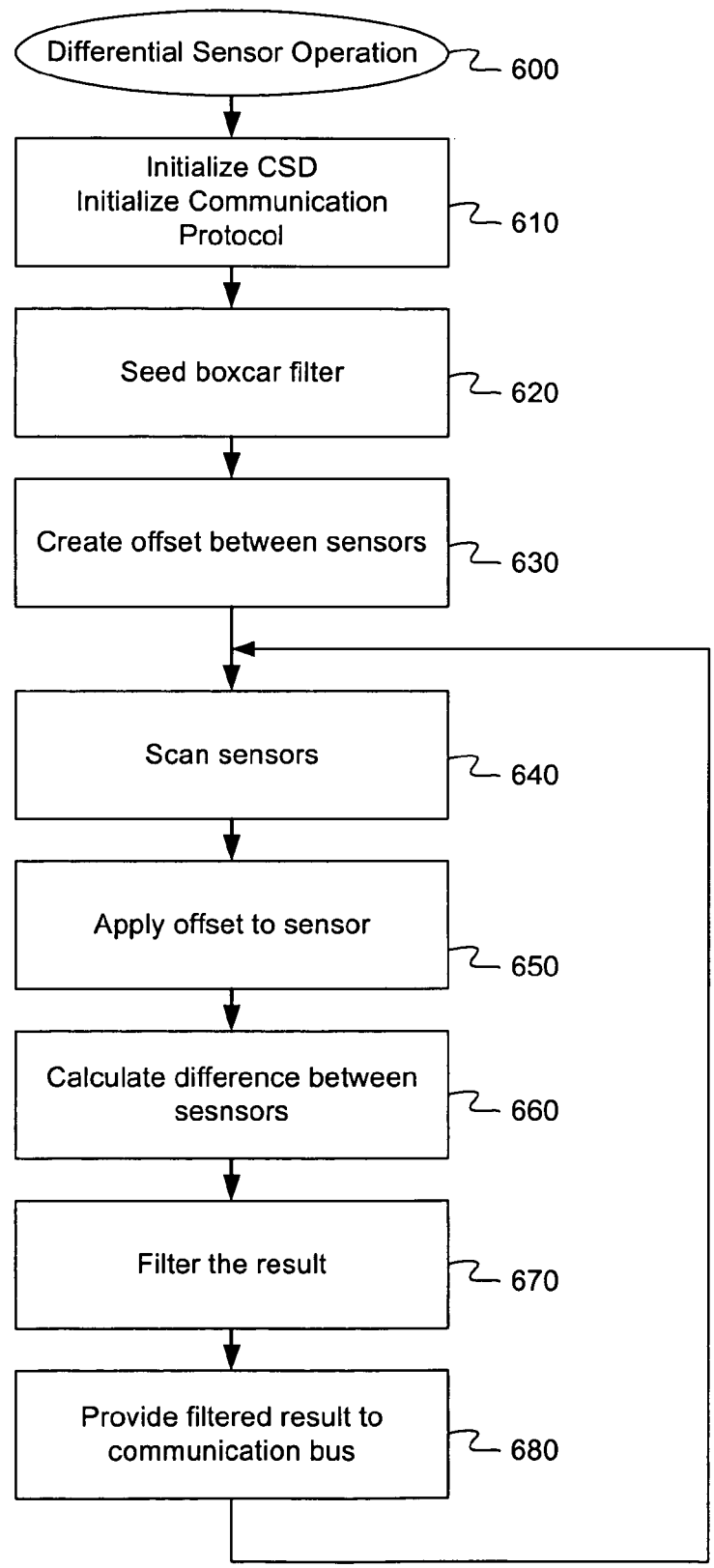
FIG. 6 is a flow diagram illustrating a method of operation of a differential capacitive sensor according to one embodiment of the present invention.

FIG. 6 is a flow diagram illustrating a method of operation of a differential capacitive sensor according to one embodiment of the present invention. In one embodiment, process 600 is used to measure a capacitance with a sensor device such as sensor device 500 of FIG. 5. At block 610, process 600 initializes the capacitance sensing algorithm and the communication protocol. The communication protocol may be one of a number of formats, for example, $I^2C$, analog voltage, digital signal, pulse wave modulation output, or other formats. In one embodiment, process 600 initializes a one word $I^2C$ buffer to return the measured count value to the requesting $I^2C$ Master. The capacitance sensing algorithm may be any one of various known methods for measuring capacitance, for example relaxation oscillator methods, current versus voltage phase shift measurement, resistor-capacitor charge timing, capacitive bridge divider, charge transfer, successive approximation, sigma-delta modulation, charge-accumulation circuits, field effect, mutual capacitance, frequency shift, or the like. In one embodiment, process 600 sets parameters for a sigma-delta modulation method to scan at a slow speed with a 16 bit resolution.

At block 620, process 600 seeds a 16-tap boxcar filter with values of zero. In alternative embodiments, other types of low pass filter may be used, for example a median cut filter, an infinite impulse response (IIR) filter with low-pass response, a finite impulse response (FIR) filter with low pass response, or other filter. Also, other seed values may be used, for example, a value closer to the offset described below. At block 630, process 600 creates an offset between the differential sensors. In one embodiment, a raw count measurement is taken by each sensor and the results are compared. An offset is calculated so that the first sensor (i.e., the sensor closest to the detergent reservoir) has a count value greater than the second sensor by at least a certain value. In one embodiment, the offset is created so that the first sensor has a count value that is at least 100 counts greater than that of the second sensor. In alternative embodiments, the offset is created for a different value. Ensuring that the first sensor has a count value greater than the second sensor may provide for ease of computation when determining the difference between sensor counts. The offset value may be stored for future use.

At block 640, process 600 scans the sensors to obtain a raw count for each sensor. At block 650, process 600 applies the offset determined above at block 630 to the raw count of the first sensor (i.e., the sensor closest to the detergent reservoir). At block 660, process 600 determines the difference between the adjusted count values of the sensors. In one embodiment, process 600 subtracts the raw count of the second sensor (i.e., the sensor furthest from the detergent reservoir) from the adjusted count (i.e., raw count with applied offset) of the first sensor. At block 670, process 600 filters the resulting difference from block 660. Process 600 may remove noise and jitter from the signal using a low pass filter. In one embodiment, process 600 uses a filter as discussed above with respect to block 620. In alternative embodiments, process 600 uses some other filter type. At block 680, process 600 provides the filtered result to the communications bus. In one embodiment, process 600 loads the filtered result to an $I^2C$ buffer for retrieval by an $I^2C$ Master. Process 600 then loops around to block 640 and continues.

Figure 7:
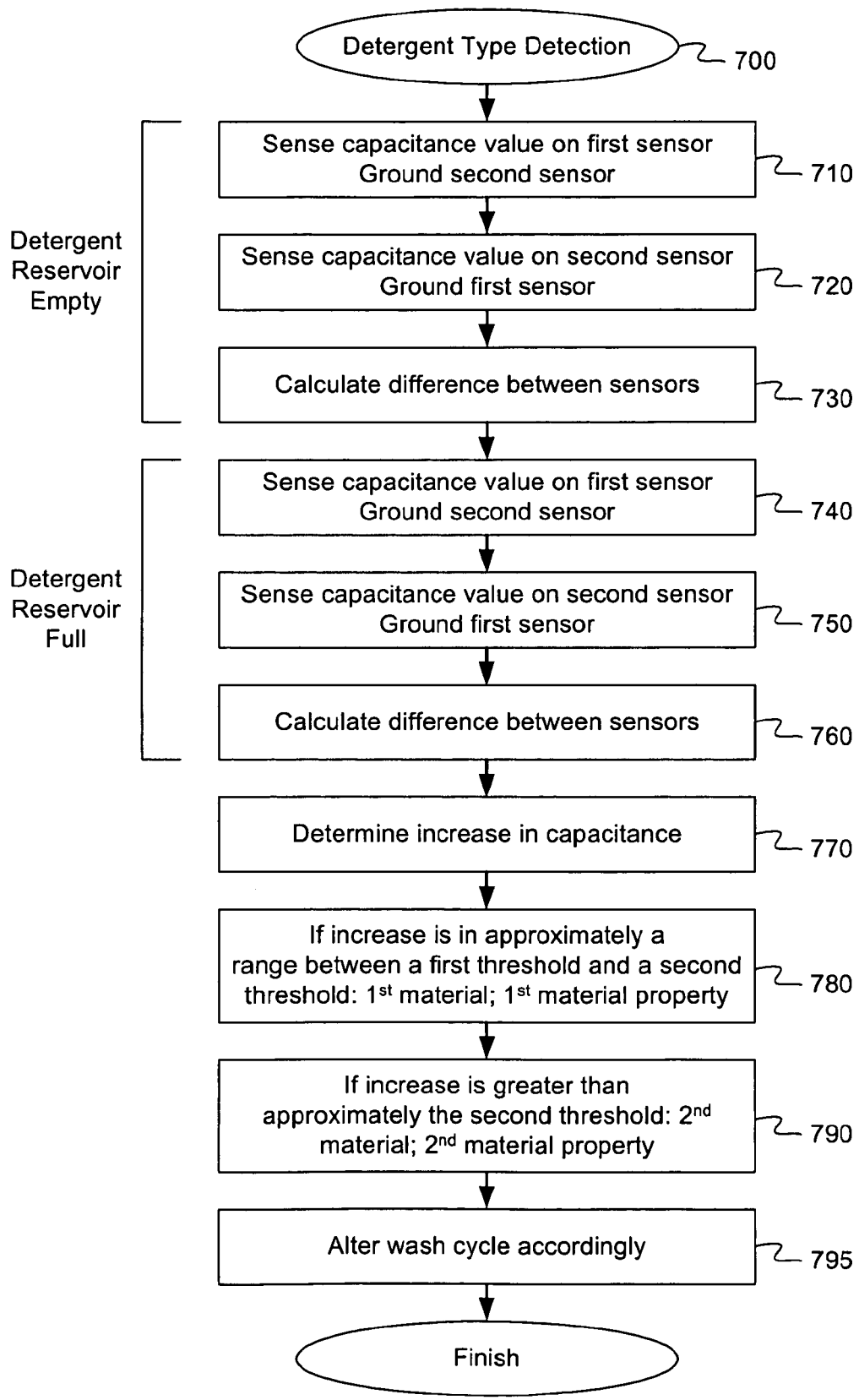
FIG. 7 is a flow diagram illustrating a method for determining the type of detergent according to one embodiment of the present invention.

FIG. 7 is a flow diagram illustrating a method for determining the type of detergent according to one embodiment of the present invention. In one embodiment, process 700 is implemented by a processing device such as processing device 370 of FIG. 3. Process 700 may use a differential capacitive sensor such as sensor device 500 of FIG. 5 and may perform a process similar to process 600 of FIG. 6. At block 710, process 700 applies a sensing signal to a first capacitive sensor (i.e., the sensor closest to the detergent reservoir, such as sensor 510 of FIG. 5) which causes the sensor to sense a capacitance value on the first capacitive sensor. The first capacitive sensor may make the measurement by taking a raw count value. In one embodiment, while the first capacitive sensor is measuring the capacitance value, process 700 grounds the second capacitive sensor (i.e., the sensor furthest from the detergent reservoir, such as sensor 520 of FIG. 5).

At block 720, process 700 senses a capacitive value on the second capacitive sensor. The second capacitive sensor may make the measurement by taking a raw count value. In one embodiment, while the second capacitive sensor is measuring the capacitance value, process 700 grounds the first capacitive sensor.

At block 730, process 700 calculates the difference between capacitance values measured by the first and second sensor. In one embodiment, process 700 subtracts the value of the second sensor from the value of the first sensor. The actions of blocks 710, 720 and 730 occur when the detergent reservoir is empty. To ensure that the detergent reservoir is empty, the measurements of blocks 710 and 720 may occur, for example, as soon as the door to the appliance is opened. In alternative embodiments, the measurements may be taken at other times.

At block 740, process 700 again senses a capacitance value on the first capacitive sensor. In one embodiment, while the first capacitive sensor is measuring the capacitance value, process 700 grounds the second capacitive sensor. At block 750, process 700 senses a capacitive value on the second capacitive sensor. In one embodiment, while the second capacitive sensor is measuring the capacitance value, process 700 grounds the first capacitive sensor.

At block 760, process 700 calculates the difference between capacitance values measured by the first and second sensor. In one embodiment, process 700 subtracts the value of the second sensor from the value of the first sensor. The actions of blocks 740, 750 and 760 occur when there is a material (e.g., detergent) present in the detergent reservoir. To ensure that the detergent reservoir is full, the measurements of blocks 740 and 750 may occur, for example, as soon as a START button is pushed on the appliance. In alternative embodiments, the measurements may be taken at other times. Since the detergent reservoir is full, the sensors are affected by capacitance attributable to the material as well as to environmental conditions. The first and second sensors are equally affected by the environmental conditions surrounding the system. Environmental conditions that may affect the measurement include temperature, humidity, etc. However, since the first sensor is located closer to the detergent reservoir than the second sensor, the first sensor will be more greatly affected by capacitance attributable to the material. Additionally, since the first sensor is grounded while the second sensor measures a count value, the first sensor acts to shield the second sensor from any capacitance attributable to the material. Since the sensors are affected equally by the environmental conditions, the difference between the two sensors will be attributable primarily to the effect of the capacitance of the material on the first sensor device.

At block 770, process 700 determines an increase in capacitance by comparing the difference between the capacitance values when the reservoir was empty (i.e., at block 730) to the difference between the capacitive values when the reservoir is full (i.e., at block 760). In one embodiment, the increase is determined by subtracting the value at block 730 from the value at block 760. If the increase is in approximately a range between a first threshold value and a second threshold value, at block 780, process 700 determines that the material is a first material having a first material property. In one embodiment, the first threshold value may be approximately 50 and the second threshold value may be approximately 150. In alternative embodiments, the first and second thresholds may have other values. If the increase is greater than approximately the second threshold value, at block 790, process 700 determines that the material is a second material having a second material property. At block 795, process 700 alters the wash cycle of the appliance according to the type of detergent.

In alternative embodiments, process 700 is applied to materials other than a gel or powder detergent. Process 700 may be used to determine whether a material is a first material having a first material property or a second material having a second material property. In one embodiment, the first material and the second material are different materials, however in alternative embodiments, the first material and the second material are the same material but have different material properties. A material property may include any property of the material, including, for example, viscosity, conductivity, permittivity, concentration, reactivity, dielectric constant, or other material property. In one embodiment, the first material is a powder and the second material is a gel. A powder may include substances consisting of ground, pulverized, or otherwise finely dispersed solid particles. A gel may be considered as a colloid in which the disperse phase has combined with the dispersion medium to produce a semisolid material, such as a jelly. In an alternative embodiment, the first material is oil and the second material is water. In another alternative embodiment, the first material is a liquid having a first dielectric constant and the second material is a liquid having a second dielectric constant. In other alternative embodiments, the first and second materials are some other material having some other material property. It should be noted that the terms first and second are used only to convey antecedent basis and should not, for example, be interpreted as requiring that a first material be different from a second material.

Figure 8:
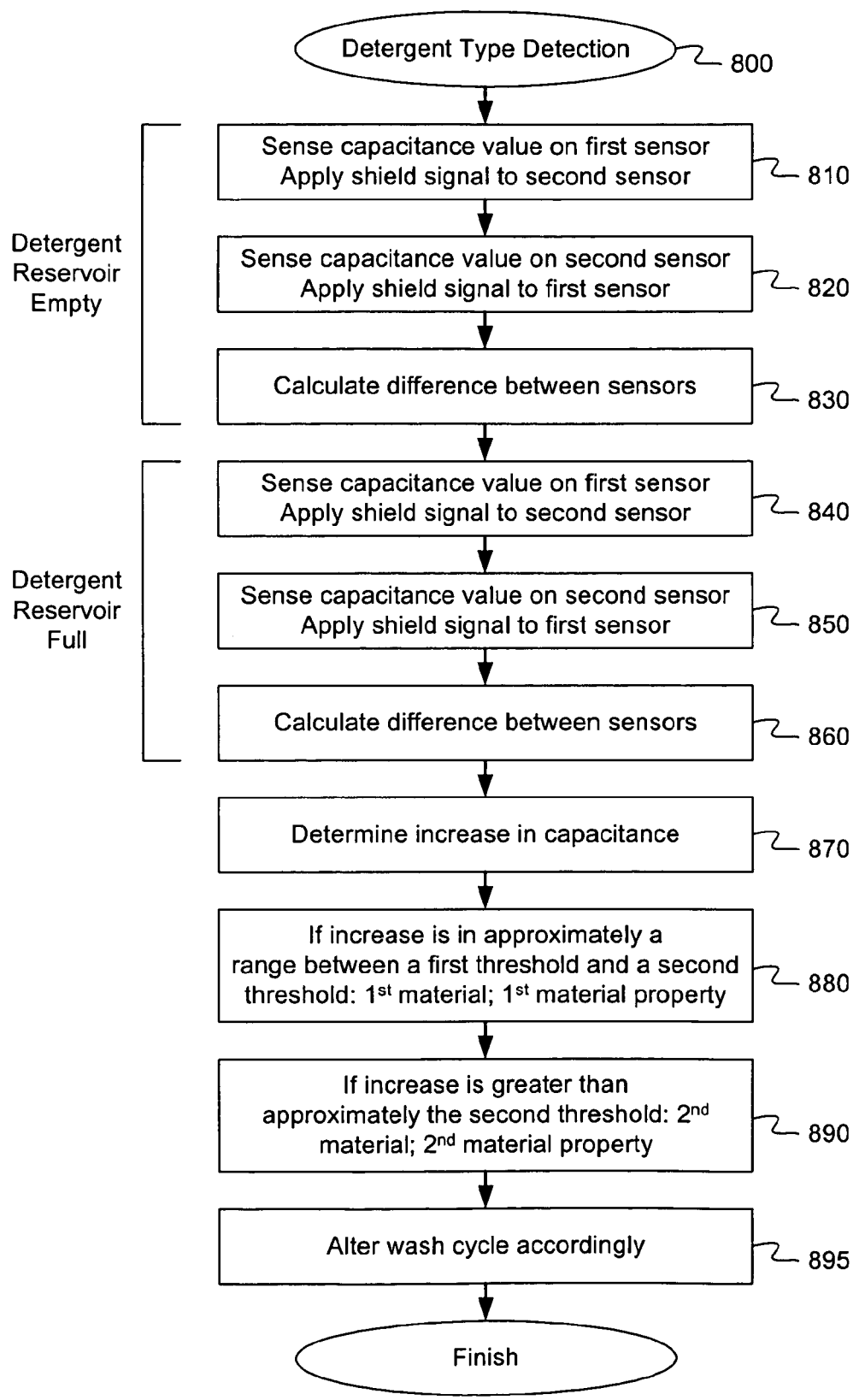
FIG. 8 is a flow diagram illustrating a method for determining the type of detergent according to one embodiment of the present invention.

FIG. 8 is a flow diagram illustrating a method for determining the type of detergent according to one embodiment of the present invention. Process 800 may be substantially similar to process 700 of FIG. 7, with the exception of applying a shield signal to the sensor not currently sensing a capacitance value at blocks 810, 820, 840 and 850 rather grounding the sensor. In one embodiment the shield signal can be applied to the sensor which is not currently scanning. In one embodiment, the shield signal is a low-impedance replica (buffered) of the sensing signal. By supplying the shield signal to the sensor which is not currently sensing a capacitance value, the base sensor (parasitic) capacitance influence is reduced, as both sensor plates of the sensor device are driven by same voltage and there is no charge-discharge inter-sensor capacitance. Blocks 830 and 860-895 may operate substantially similar to the corresponding blocks of process 700 of FIG. 7.

Figure 9:
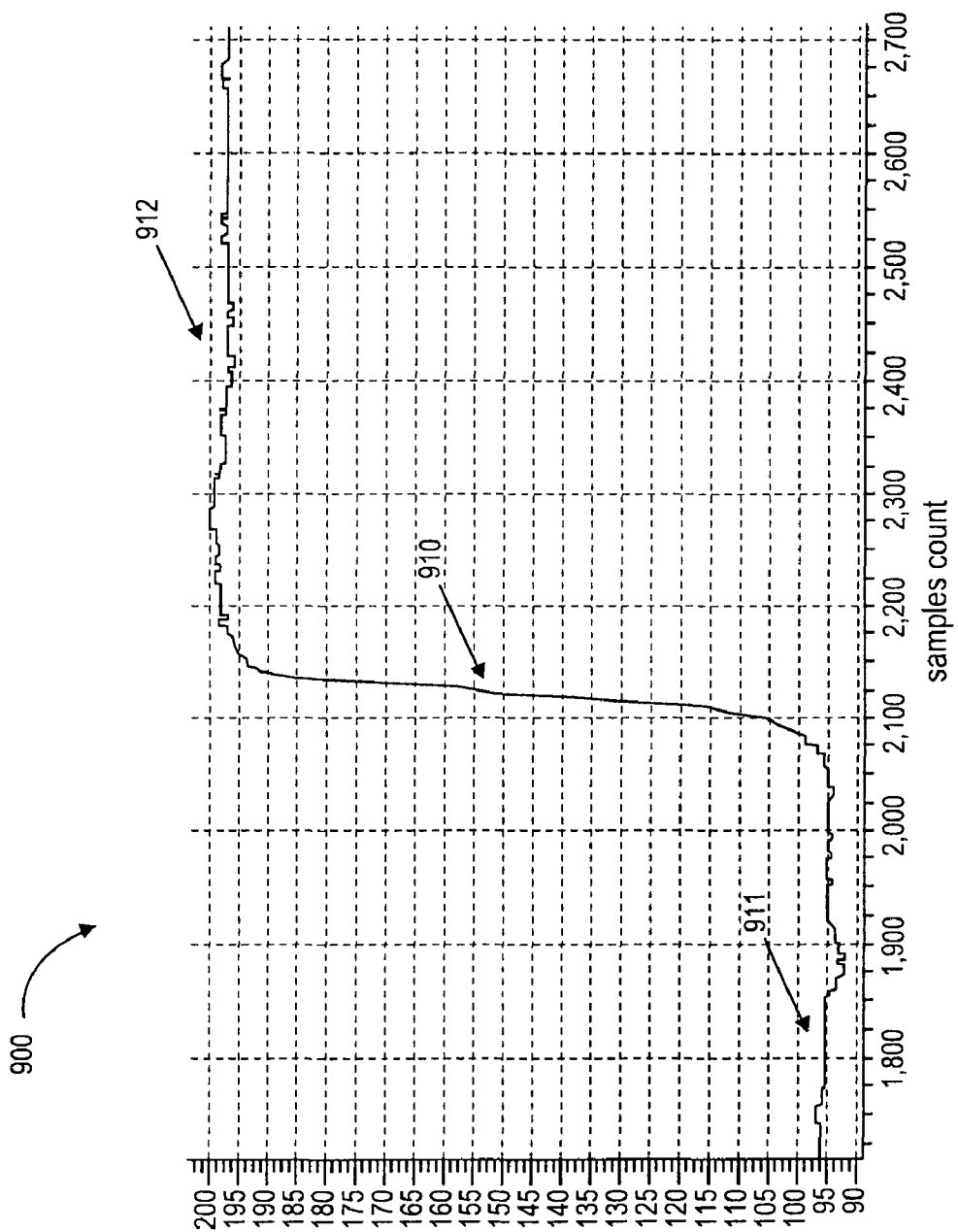
FIG. 9 illustrates a graph of the count values measured by capacitive sensing devices in the presence of powder detergent.

FIG. 9 illustrates a graph of the count values measured by capacitive sensing devices in the presence of powder detergent. In one embodiment, graph 900 includes curve 910 which represents the difference in raw counts measured by two capacitive sensor devices, such as capacitive sensor devices 510 and 520 of FIG. 5. Section 911 represents the difference in raw counts when no detergent is present (i.e., detergent reservoir 210 is empty). Section 912 represents the difference in raw counts when powdered detergent is present (i.e., detergent reservoir 210 contains powdered detergent). In this example, when no detergent is present (i.e., section 911) the difference in count values is approximately 95. When powdered detergent is added (i.e., section 912) the difference in count values increases to approximately 197. Thus, there is an increase of approximately 102 when powdered detergent is added. In alternative embodiments, the increase attributable to powdered detergent is in approximately a range of 50 to 150. In other alternative embodiments, the increase may include other values. The capacitance raw count values may depend on the sensor construction, area, sensing scheme and material dielectric constant and are thus provided here for example only.

Figure 10:
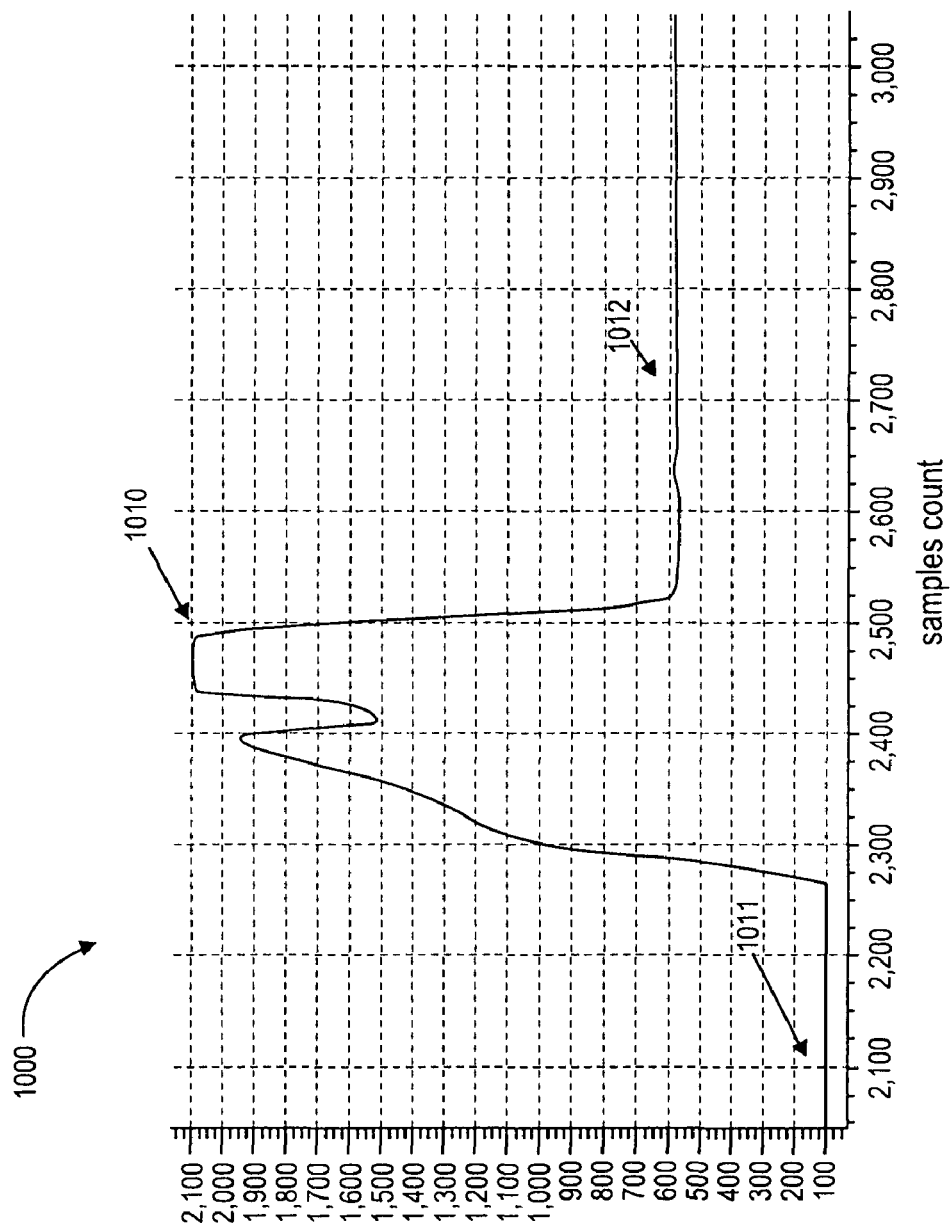
FIG. 10 illustrates a graph of the count values measured by capacitive sensing devices in the presence of gel detergent.

FIG. 10 illustrates a graph of the count values measured by capacitive sensing devices in the presence of gel detergent. In one embodiment, graph 1000 includes curve 1010 which represents the difference in raw counts measured by two capacitive sensor devices, such as capacitive sensor devices 510 and 520 of FIG. 5. Section 1011 represents the difference in raw counts when no detergent is present (i.e., detergent reservoir 210 is empty). Section 1012 represents the difference in raw counts when gel detergent is present (i.e., detergent reservoir 210 contains gel detergent). In this example, when no detergent is present (i.e., section 1011) the difference in count values is approximately 100. When gel detergent is added (i.e., section 1012) the difference in count values increases to approximately 575. Thus, there is an increase of approximately 475 when gel detergent is added. In alternative embodiments, the increase attributable to gel detergent is greater than approximately 150. In other alternative embodiments, the increase may include other values. The capacitance raw count values may depend on the sensor construction, area, sensing scheme and material dielectric constant and thus are provided here for reference only.

Embodiments of the present invention include various operations. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing device(s) described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing device(s) and special-purpose processing device(s).

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader scope of the invention as set forth in the appended claims. The specification and drawings are, accordingly, to be regarded in an illustrative sense rather than a restrictive sense.

What is claimed is:

1. A processing device implemented method comprising:
   detecting a presence of a material at a sensing device;
   wherein the sensing device comprises a first capacitive sensor configured to detect the presence of the material and an environmental effect on the sensing device, and a second capacitive sensor configured to detect the environmental effect on the sensing device; and
   determining whether the material is a first material having a first material property or a second material having a second material property.

2. The method of claim 1, wherein the first material comprises a powder and the second material comprises a gel.

3. The method of claim 1, wherein the first and second materials comprise a liquid and wherein the first material property comprises a first dielectric constant of the liquid and the second material property comprises a second dielectric constant of the liquid.

4. The method of claim 1, wherein detecting the presence of the material comprises measuring a capacitance value sensed by each of the first and second capacitive sensors.

5. The method of claim 4, further comprising:
   applying an offset to the first capacitive sensor such that the capacitance value measured by the first capacitive sensor is greater than the capacitance value measured by the second capacitive sensor.

6. The method of claim 5, further comprising:
   determining a difference between the capacitance values sensed by the first and second capacitive sensors.

7. The method of claim 6, wherein determining whether the material is the first material having the first material property or the second material having the second material property comprises:
   determining an increase in capacitance by comparing the difference between the capacitance values before the material is detected to the difference between the capacitance values after the material is detected.

8. The method of claim 7, further comprising:
   if the increase in capacitance is in approximately a range between a first threshold value and a second threshold value, determining that the material is the first material having the first material property; and if the increase in capacitance is greater than approximately the second threshold value, determining that the material is the second material having the second material property.

9. The method of claim 5, further comprising:
grounding the second capacitive sensor while the first capacitive sensor measures a first capacitance value and grounding the first capacitive sensor while the second capacitive sensor measures a second capacitance value.

10. The method of claim 5, further comprising:
applying a shield signal to the second capacitive sensor while the first capacitive sensor measures a first capacitance value and applying the shield signal to the first capacitive sensor while the second capacitive sensor measures a second capacitance value.

11. An electronic system comprising:
a processing device configured to receive signals from a sensing device, the processing device to determine whether a material present at the sensing device is a first material having a first material property or a second material having a second material property;
a first capacitive sensor configured to detect the presence of the material and an environmental effect on the sensing device; and
a second capacitive sensor configured to detect the environmental effect on the sensing device.

12. The electronic system of claim 11, wherein the first material comprises a powder and the second material comprises a gel.

13. The electronic system of claim 11, wherein the first material comprises oil and the second material comprises water.

14. The electronic system of claim 11, wherein the processing device comprises one or more capacitance sensors coupled to the sensing device, and wherein the one or more capacitance sensors are configured to measure a capacitance at the sensing device to detect the presence of the material at the sensing device.

15. The electronic system of claim 11, wherein the first and second capacitive sensors are configured to measure a capacitance value.

16. The electronic system of claim 15, wherein the processing device is configured to determine a difference between the capacitance values measured by the first and second capacitive sensors.

17. The electronic system of claim 16, wherein the processing device is configured to determine an increase in capacitance by comparing the difference between the capacitance values before the material is detected to the difference between the capacitance values after the material is detected.

18. The electronic system of claim 17, wherein determining whether the material is the first material having the first material property or the second material having the second material property comprises:
if the increase in capacitance is in approximately a range between a first threshold value and a second threshold value, determining that the material is the first material having the first material property; and
if the increase in capacitance is greater than approximately the second threshold value, determining that the material is the second material having the second material property.

19. The electronic system of claim 11, wherein the sensing device comprises:
a capacitive sensor configured to detect the presence of the material; and
an environmental sensor.

20. An apparatus comprising:
means for detecting a presence of a material near a sensing device; and means for determining whether the material is a first material having a first material property or a second material having a second material property;
means for detecting the presence of the material and an environmental effect on the sensing device; and
means for detecting the environmental effect on the sensing device.

21. The apparatus of claim 20, wherein the first material comprises a powder and the second material comprises a gel.

22. The apparatus of claim 20, wherein the means for determining whether the material is the first material having the first material property or the second material having the second material comprises a non-contact means.

23. The apparatus of claim 20, further comprising:
means for compensating for an environmental effect on the sensing device in detecting the presence of the material.

* * * * *